United States Patent
Ku et al.

(10) Patent No.: US 7,232,756 B2
(45) Date of Patent: Jun. 19, 2007

(54) NICKEL SALICIDE PROCESS WITH REDUCED DOPANT DEACTIVATION

(75) Inventors: Ja-Hum Ku, Seongnam-si (KR);
Kwan-Jong Roh, Gunpo-si (KR);
Min-Chul Sun, Hwaseong-si (KR);
Min-Joo Kim, Seoul (KR); Sug-Woo Jung, Suwon-si (KR); Sun-Pil Youn, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/812,003

(22) Filed: Mar. 30, 2004

(65) Prior Publication Data

US 2004/0209432 A1    Oct. 21, 2004

Related U.S. Application Data

(63) Continuation-in-part of application No. 10/726,638, filed on Dec. 4, 2003.

(30) Foreign Application Priority Data

Apr. 16, 2003   (KR)   ........................ 10-2003-0024126
Jun. 27, 2003   (KR)   ........................ 10-2003-0042838

(51) Int. Cl.
*H01L 21/44*   (2006.01)

(52) U.S. Cl. ................. 438/682; 438/660; 257/E21.199

(58) Field of Classification Search ................. 438/282
See application file for complete search history.

(56) References Cited

U.S. PATENT DOCUMENTS 5,891,784 A     4/1999   Cheung et al.
6,300,239 B1   10/2001   Ono
6,329,276 B1 * 12/2001   Ku et al. ..................... 438/586
6,339,018 B1 *  1/2002   Ballantine et al. .......... 438/586
6,458,702 B1 * 10/2002   Aloni ......................... 438/682
6,518,631 B1 *  2/2003   En et al. ..................... 257/382
2002/0068408 A1  6/2002  Paton et al.
2004/0123922 A1 * 7/2004  Cabral et al. ............... 148/527

FOREIGN PATENT DOCUMENTS

WO      WO 02/47145 A1     6/2002

OTHER PUBLICATIONS

Wolf, Stanley; "Silicon Processing for the VLSI ERA" vol. 2: Process Integration; 1990 by Lattice Press.; pp. 104-105.*
Stanley Wolf and Richard N. Tauber; "Silicon Processing for the VLSI Era" vol. 1: Process Technology; 1986 by Lattice Press; pp. 303-305 and 397-399.*
German Office Action dated May 10, 2006 and received May 22, 2006.

* cited by examiner

*Primary Examiner*—Michael Lebentritt
*Assistant Examiner*—Cheung Lee
(74) *Attorney, Agent, or Firm*—Harness, Dickey & Pierce

(57) ABSTRACT

Provided are exemplary methods for forming a semiconductor devices incorporating silicide layers formed at temperatures below about 700° C., such as nickel silicides, that are formed after completion of a silicide blocking layer (SBL). The formation of the SBL tends to deactivate dopant species in the gate, lightly-doped drain and/or source/drain regions. The exemplary methods include a post-SBL activation anneal either in place of or in addition to the traditional post-implant activation anneal. The use of the post-SBL anneal produces CMOS transistors having properties that reflect reactivation of sufficient dopant to overcome the SBL process effects, while allowing the use of lower temperature silicides, including nickel silicides and, in particular, nickel silicides incorporating a minor portion of an alloying metal, such as tantalum, the exhibits reduced agglomeration and improved temperature stability.

38 Claims, 16 Drawing Sheets

NICKEL SALICIDE PROCESS WITH REDUCED DOPANT DEACTIVATION

PRIORITY STATEMENT

This application claims priority under 35 U.S.C. § 119 from Korean Patent Application Nos. 2003-24126, filed on Apr. 16, 2003, and 2003-42838, filed on Jun. 27, 2003, in the Korean Intellectual Property Office, and under 35 U.S.C. § 120 as a continuation-in-part of U.S. patent application Ser. No. 10/726,638, filed Dec. 4, 2003, the disclosures of these priority documents are hereby incorporated by reference in their entirety.

BACKGROUND OF THE INVENTION

1. Field of the Invention

The present invention relates to an improved method for fabricating semiconductor devices and, more particularly, an improved method for forming salicide structures during semiconductor device manufacturing processes using nickel, a nickel alloy, or another metal or metal alloy capable of forming silicides at lower temperatures, e.g., less than about 725° C., to form the salicide layer and modifying the heat treatment sequence to reactivate previously deactivated dopant atoms.

2. Description of the Related Art

As the integration density of semiconductor devices continues to increase and the critical dimensions associated with such devices continue to decrease, there has been a corresponding increase in interest in identifying materials and processes for producing interest in low resistance materials to maintain or reduce signal delay. Silicide and salicide (self-aligned silicide) materials and processes have been widely used to lower the sheet resistance and contact resistance for the gate conductor and source/drain regions of MOS devices.

A number of metals, including tungsten, tantalum, zirconium, titanium, hafnium, platinum, palladium, vanadium, niobium, cobalt, nickel and various alloys of such metals have been used to form silicide layers on semiconductor devices. For gate lengths below about 100 nm, however, conventional salicide processes and materials tend to experience a variety of difficulties including opens, residues and layer non-uniformity, resulting at least in part from agglomeration within the silicide material layer.

These difficulties tend to be exacerbated by the high-temperature processing required to react most metal(s) with silicon to form the desired silicide layers. The high temperature anneals required also raise concerns regarding the impact of the silicide annealing process(es) on the thermal budget for the devices being manufactured. For example, when cobalt is used to form the silicide, the initial stoichiometry of the silicide may be generally represented as CoSi, but as the annealing process continues, particularly at higher temperatures, the silicide tends to incorporate an increasing amount of silicon and approaches a composition more closely represented as $CoSi_2$. For devices having gate lengths below about 100 nm, however, the second high temperature silicidation used in conventional Co salicide processes tends to induce agglomeration within the silicide material layer, increasing the degree of non-uniformity within the layer and tending to degrade the performance of the resulting devices.

A conventional salicide process sequence is illustrated in FIG. 1, wherein, after forming a gate structure (S10), a first ion implant process is used to form a lightly-doped drain (S20), gate spacers are formed (S30) adjacent the gate electrode sidewalls, a heavier source/drain (S/D) implant (S40) is used to form the S/D regions in the substrate, and an activation anneal (S50) is conducted to activate a portion of the implanted dopant(s) to modify the performance of the implanted regions of the substrate. After the dopant activation anneal, a silicide blocking layer is formed (S60), a silicidation metal or metal alloy layer is formed and a salicide pattern is formed by reacting the silicidation metal(s) with exposed silicon surfaces, after which the remainder of the silicidation metal(s) are removed (S70). Once the salicide pattern has been formed, the unreacted portion of the silicidation metal(s) may be removed and an interlayer dielectric formed (S80) to begin the metallization process.

Nickel is an attractive metal for forming silicides because the annealing process required to form the desired silicide may be conducted at a relatively low temperature, e.g., below about 550° C. Depending on the reaction conditions, nickel can react with silicon to form dinickel monosilicide, $Ni_2Si$, nickel silicide, NiSi, or nickel disilicide, $NiSi_2$, as the silicidation product. Using annealing temperatures greater than about 550° C. tends to increase the formation of the most resistive nickel-disilicide $NiSi_2$ and a corresponding increase in the silicon consumption and are, therefore, generally avoided. Nickel silicide, NiSi, however, can be preferentially formed at lower temperatures and provides the lowest sheet resistance of the three nickel silicide phases. Due to the low silicidation temperature, NiSi exhibits a decreased tendency to agglomerate and form a silicide layer in which the sheet resistance is generally independent of the device dimensions, increasing its utility for lowering the resistance of fine line structures.

SUMMARY OF THE INVENTION

Embodiments of the present invention provide methods of forming gate pattern, performing one or more dopant implants, typically a lightly-doped drain (LDD) implant, followed by gate spacer formation and a source drain (S/D) implant, forming a silicide blocking layer (SBL), activating (or reactivating) the dopant, depositing a silicidation metal or metal alloy and forming a silicide layer by reacting the metal or metal alloy with the exposed portions of the silicon at a silicidation temperature of less than about 700° C., such as nickel and nickel/tantalum alloys, to produce a salicide pattern.

When the heat processes associated with lower temperature SBL and salicide pattern formation, e.g., involving temperatures typically less than about 700° C., the heat budget associated with the processes are reduced, allowing the formation of more highly integrated devices, however, these lower temperature processes are also associated with dopant deactivation that will tend to increase the resistance and threshold voltages of the resulting devices and reduce their performance accordingly.

Exemplary methods of forming such lower temperature nickel silicide layers may include forming a capping layer of a material such as titanium nitride, TiN, and particularly a nitrogen-rich TiN layer, i.e., a TiN layer having a N:Ti atomic ratio of at least about 0.5, on the nickel alloy layer prior to forming the silicide. The alloying metal selected should exhibit both a diffusivity and a solubility in silicon that are lower than the corresponding values for nickel. The alloying metal should also exhibit a silicidation temperature in excess of that necessary to form nickel silicide.

Depending on the particular process flow used to prepare the substrate prior to the deposition of the metal or metal/alloy, metal silicides according to the exemplary embodiments of the invention may be formed only on the gate electrode structure, only on the surface of active regions, e.g., the source/drain regions of MOS transistors, or on both the gate electrode and the active regions.

In those instances in which the metal silicide will not be formed on the gate electrode, the gate electrode structure will typically include one or more capping or SBL layers to protect any polysilicon layer incorporated in the gate electrode structure above the gate dielectric layer. In those instances in which the metal silicide will be limited to the gate electrode, a sequence of insulator deposition, typically one or more layers of a chemical vapor deposition (CVD) oxide, can be formed on the substrate. The upper portion of the insulator(s) may then be removed using, for example, a chemical-mechanical polishing or etchback process, to expose an upper silicon surface on the gate electrode structure while protecting the active regions from exposure to the metal or metal alloy.

In each instance, a layer of a metal or metal alloy will be deposited on a substrate having regions with exposed silicon and/or polysilicon surfaces, typically ("Typically" does not mean to imply prior art.) followed by the deposition of an optional capping layer such as TiN. A heat treatment, typically at a temperature of at least 250° C. and typically less than 700° C., will be used to react the metal or metal alloy with the exposed silicon surfaces to form the desired silicide. The capping layer and the unreacted metal or metal alloy may then be removed to prepare the substrate for additional processing.

When the primary silicidation metal is nickel, one or more alloying metals may be selected from a group consisting of tantalum, vanadium, zirconium, hafnium, tungsten, cobalt, platinum, chromium, palladium and niobium, but the total content of the alloying metals will typically constitute no more than about 20 atomic percent of the nickel alloy and may be present at content levels over 0.1 atomic percent. The nickel silicide formation will typically include heating the nickel alloy in contact with a silicon surface to a temperature above about 200° C. and below about 700° C., more typically between about 250° C. and about 500° C., for a period of at least about 10 seconds and possibly for as long as 30 minutes or more. When using a nickel alloy, particularly a nickel-tantalum alloy, the particular time and temperature combination selected should preferably be sufficient to produce a two-layered nickel silicide structure in which the majority of the nickel is present in the lower layer as NiSi and the majority of the alloying metal has been segregated into the upper layer.

Although the nickel silicides prepared according to the exemplary embodiments of the present invention tend to exhibit higher thermal stability, particularly at temperatures above about 600° C., than nickel silicides prepared from unalloyed nickel, the thermal activity of subsequent processes should generally be selected to maintain the majority, typically at least 90%, of the lower layer of the silicide in the initial NiSi phase, i.e., suppress conversion of NiSi to $NiSi_2$, in the final semiconductor device.

Nickel silicides prepared according to the exemplary embodiments of the present invention exhibit performance improvements over both nickel silicides prepared from unalloyed nickel and more conventional cobalt silicides, particularly for devices incorporating gate structures below 100 nm and more particularly for devices incorporating gate structures below 50 nm. In particular, nickel silicides according to the present invention tend to exhibit lower and more stable sheet resistance, both upon formation and particularly after additional thermal processing.

Similarly, devices incorporating nickel silicides according to the exemplary embodiments tend to exhibit improved threshold voltages $V_{th}$, reduced diode leakage currents, improved off-current $I_{doff}$ and saturation current $I_{dsat}$ performance over the performance provided by identical devices incorporating cobalt silicides, particularly in PMOS devices. The addition of a high tensile tension capping layer such as, for example, a SiON layer, particularly on NMOS transistors that incorporate the exemplary nickel silicides according to the invention can further improve NMOS device performance.

BRIEF DESCRIPTION OF THE DRAWINGS

Exemplary embodiments of the devices and methods that may be utilized to practice the present invention are addressed more fully below with reference to the attached drawings in which.

Figure 1:
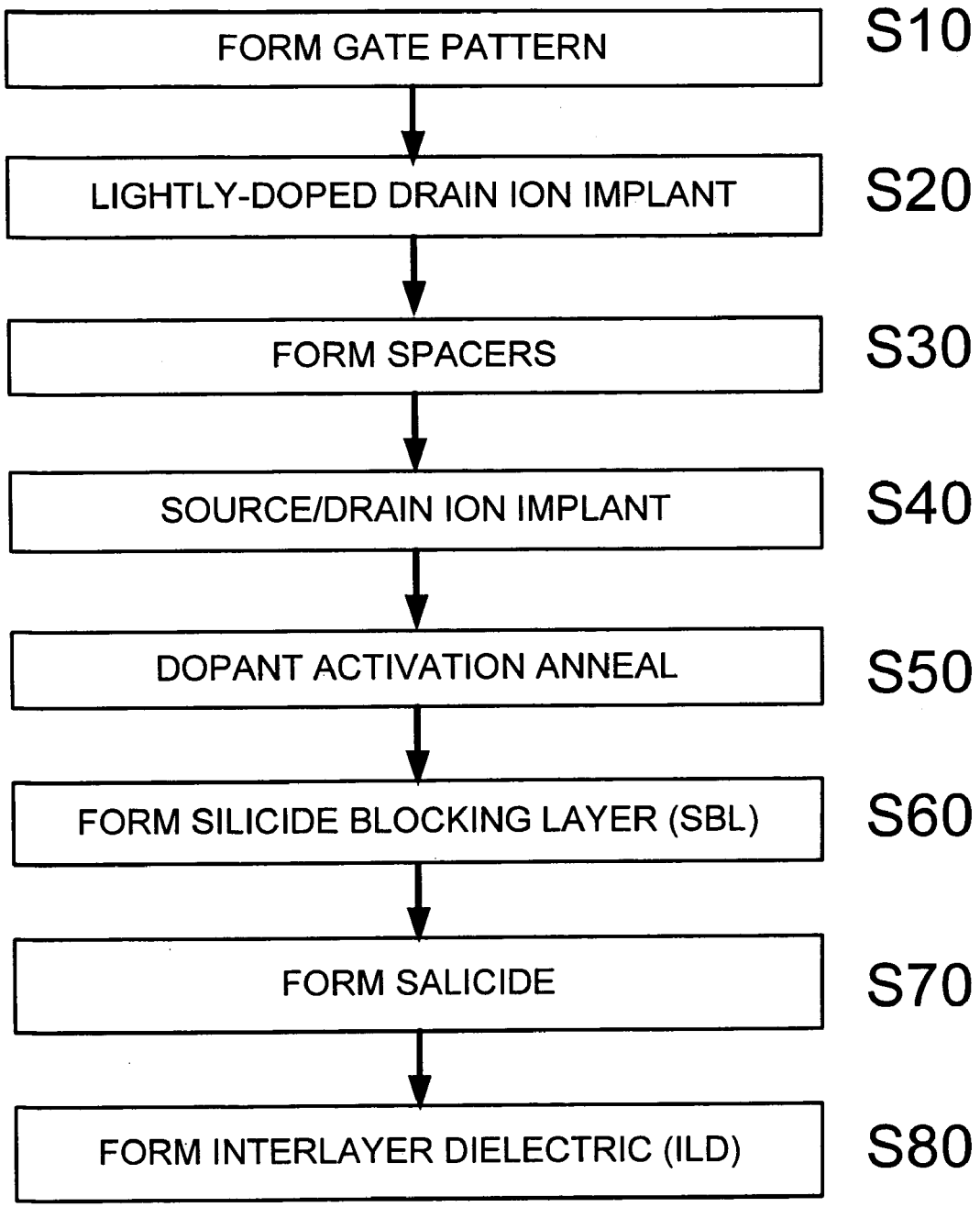
FIG. 1 illustrates certain of the process steps in a conventional method for manufacturing semiconductor devices incorporating a salicide structure.

These drawings are provided to assist in the understanding of the exemplary embodiments of the invention as described in more detail below and should not be construed as unduly limiting the invention. The relative spacing, sizing and dimensions of the various elements illustrated in the drawing are not drawn to scale and may have been exaggerated, reduced or otherwise modified for the purpose of improved clarity. Those of ordinary skill in the art will also appreciate that certain layers that may be commonly utilized in the manufacture of semiconductor devices including, for example, photoresist patterns and multilayer metallization structures, have been omitted simply to improve clarity and reduce the number of drawings.

DETAILED DESCRIPTION OF EXEMPLARY EMBODIMENTS

Figure 3A:
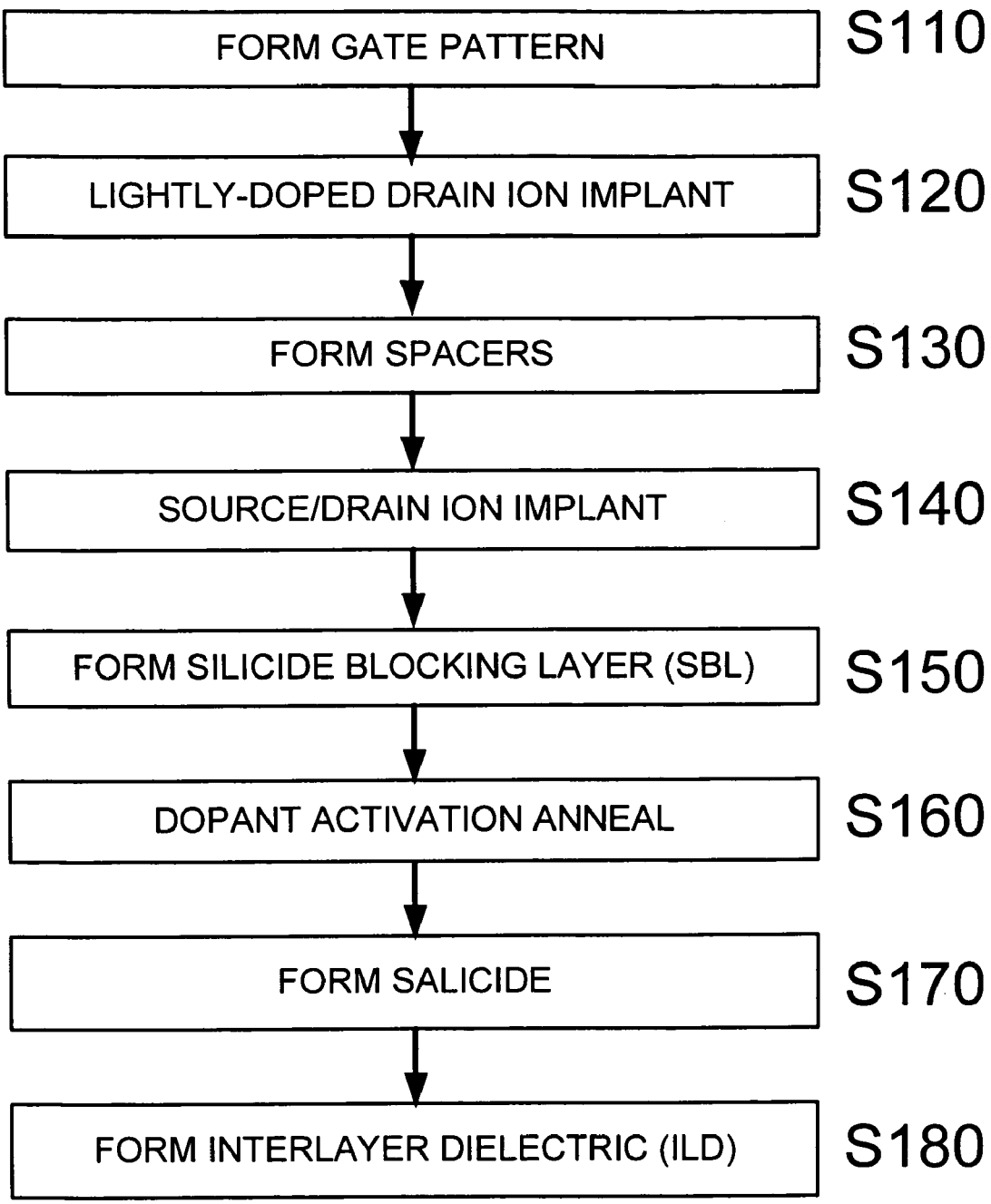
FIGS. 3A and 3B illustrates certain of the process steps according to two exemplary methods for manufacturing semiconductor devices incorporating a salicide structure according to the present invention.

As illustrated in FIG. 3A, an exemplary method of forming a semiconductor device according to the present invention will include the steps of forming a gate pattern, S110, forming a lightly-doped drain (LDD) using the gate pattern as the implant mask, S120, forming spacer structures adjacent the sidewalls of the gate pattern, S130, forming the source/drain regions using the gate pattern and the spacer structures as the implant mask, S140, forming a silicide blocking layer (SBL), S150, performing a dopant activation anneal, S160, forming a salicide pattern, S170, and forming an interlayer dielectric (ILD), S180, to begin the metallization process by which the active devices are connected to each other and external contacts. The silicidation process may include sequentially depositing a nickel alloy and a titanium nitride layer, heating to a temperature sufficient for the nickel alloy to form a silicide with the exposed silicon surfaces.

Figure 3B:
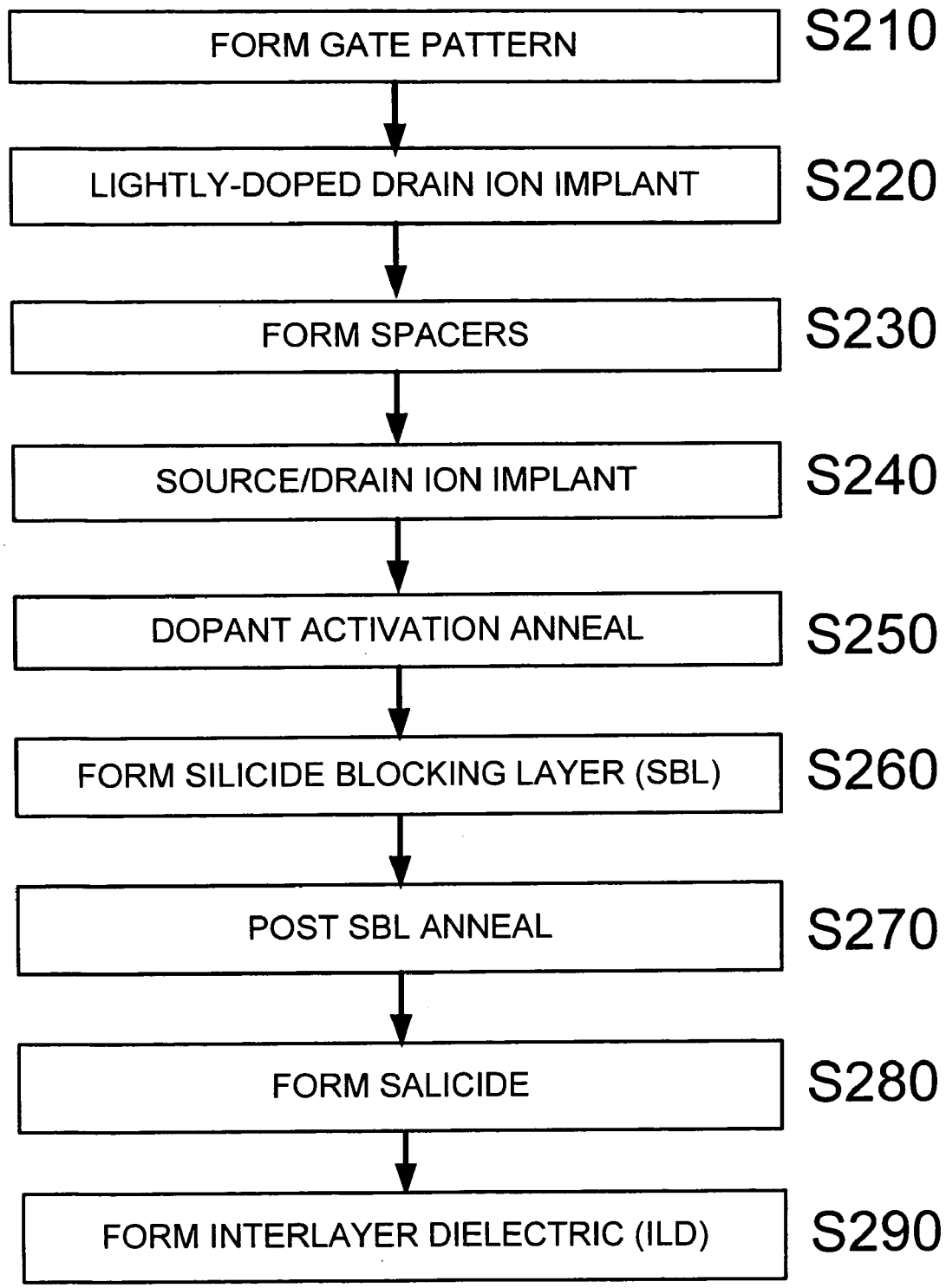

As illustrated in FIG. 3B, another exemplary method of forming a semiconductor device according to the present invention will include the steps of forming a gate pattern, S210, forming a lightly-doped drain (LDD) using the gate pattern as the implant mask, S220, forming spacer structures adjacent the sidewalls of the gate pattern, S230, forming the source/drain regions using the gate pattern and the spacer structures as the implant mask, S240, performing a first dopant activation anneal, S250, forming a silicide blocking layer (SBL), S260, performing a post-SBL anneal anneal, S270, forming a salicide pattern, S280, and forming an interlayer dielectric (ILD), S290, to begin the metallization process by which the active devices are connected to each other and external contacts.

Figure 4A:
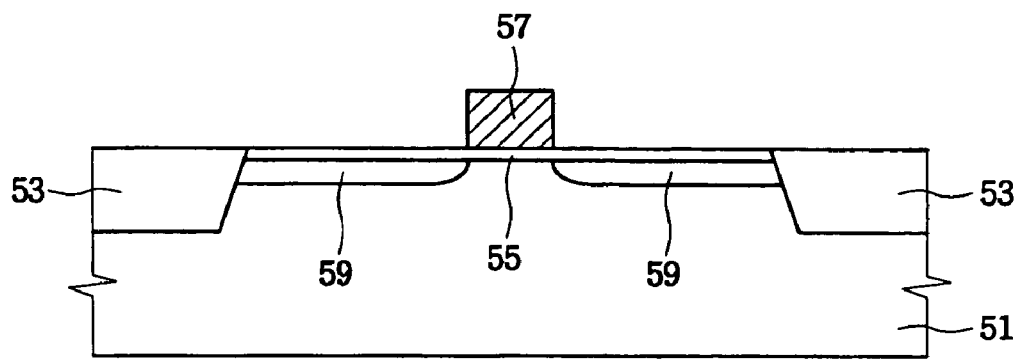
FIGS. 4A-4G illustrate certain of the steps associated with the manufacture of semiconductor devices incorporating a salicide structure according to the exemplary embodiments of the invention.

As illustrated in FIG. 4A, a semiconductor device may be formed in a substrate 51 on which or into which isolation regions 53 are formed to define an active region using a conventional shallow-trench isolation (STI) process. As illustrated, a gate structure including a gate insulator layer 55, a gate electrode 57, which may include a first conductor layer, such as doped polysilicon, a barrier layer, such as tungsten nitride, a second conductor layer, such as tungsten, and, optionally, a capping layer, may be formed in the active region. Using the gate structure as an implant mask, a first ion implant process may be used to form a lightly doped region 59, such as a lightly-doped drain region near the surface of the exposed regions of the active region.

Figure 4B:
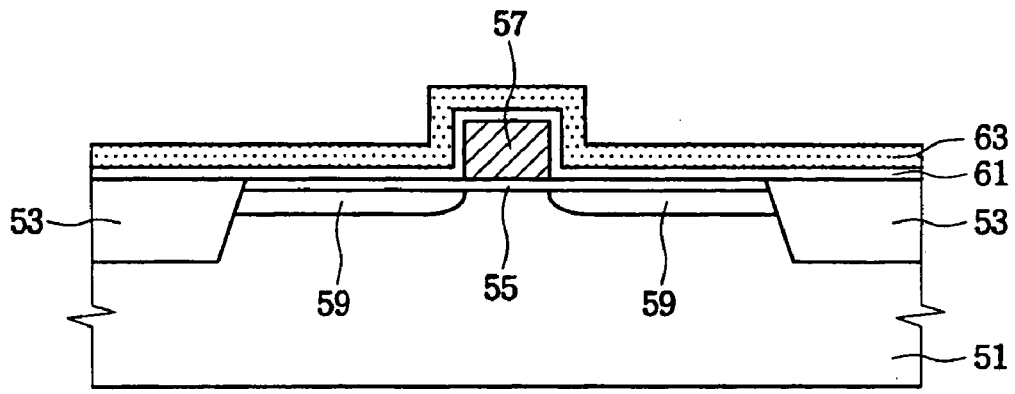
Figure 4C:
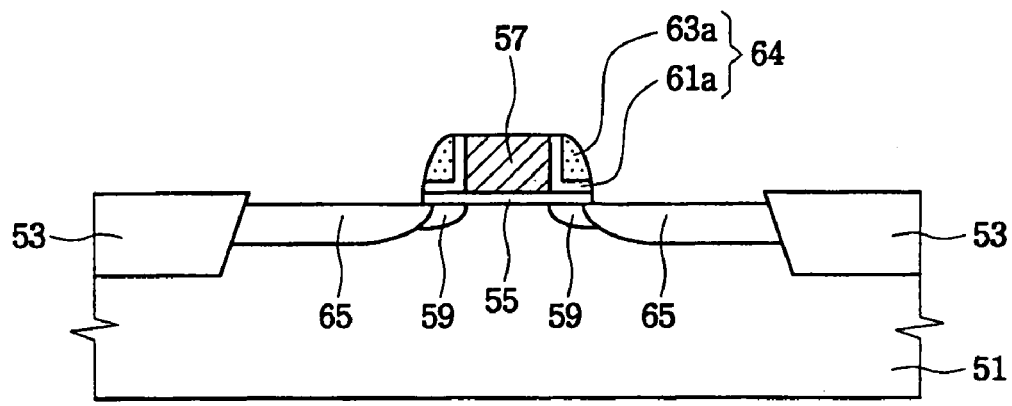

As illustrated in FIGS. 4B-C, sidewall structures may then be formed adjacent the vertical surfaces of the gate structure using a conventional process involving the deposition of one or more insulating layers, which may include a first material 61, typically silicon oxide, and a second material 63, typically silicon nitride, followed by an etchback process to form spacer 64 from the remaining portions 61a and 63a of the silicon oxide and silicon nitride layers. Using the gate electrode 57 and sidewall structures 64 as an implant mask, a second ion implant may be used to deposit a heavier concentration of dopant 65 into the exposed regions of the active region to complete the formation of the device source/drain regions adjacent the gate electrode.

Figure 4D:
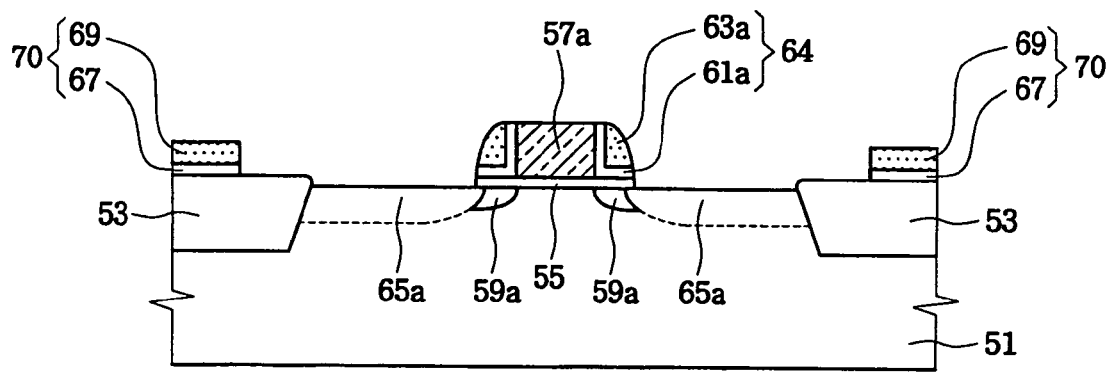

As illustrated in FIG. 4D, a silicide blocking layer (SBL) 70, typically comprising a silicon oxide layer 67 and a silicon nitride layer 69, is then formed on the substrate to protect those regions other than the active regions, particularly those regions dedicated to the formation of elements, such as resistors utilized in electrostatic discharge (ESD) protection circuits, that require a higher sheet resistance to operate properly. Although illustrated as a combination of silicon oxide and silicon nitride, the SBL may be formed from a single material, such as silicon nitride, or combinations of other suitable materials as desired. The layer(s) comprising the SBL may be deposited using a chemical vapor deposition (CVD) process, typically at a temperature between about 535° C. and about 825° C. For example, CVD silicon nitride may be formed at about 700° C.

However, at the process temperatures typically used during the formation of the SBL, a portion of the dopant impurities present in the gate electrode structure 57a, typically phosphorus-doped polysilicon, the LDD region 59a and the S/D regions 65a tend to be deactivated. The deactivation of these dopants will tend to increase the resistance of the doped regions, increase the junction leakage and reduce the gate capacitance, all changes that tend to degrade the performance of the resulting semiconductor devices.

Figure 4E:
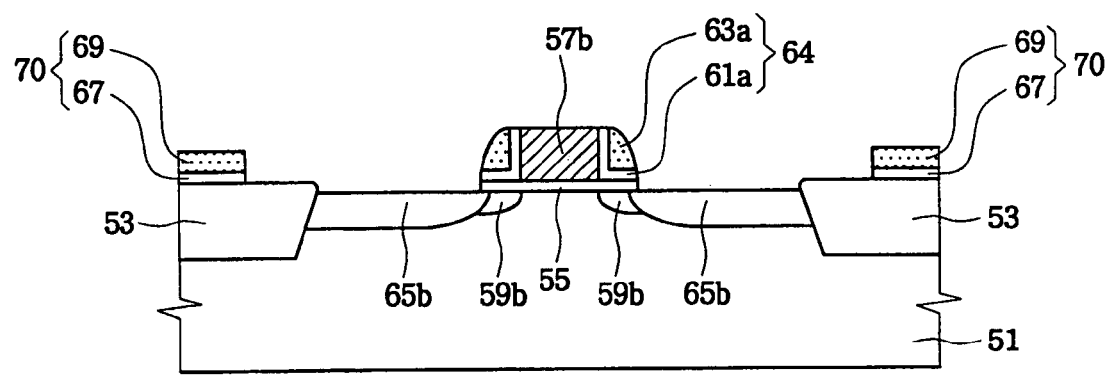

As illustrated in FIG. 4E, after the SBL has been formed, the substrate may be subjected to a post-SBL anneal to activate or reactivate a portion of the inactive or deactivated dopant species and form reactivated gate electrode structures 57b, LDD regions 59b and S/D regions 65b that exhibit correspondingly improved resistance, leakage and capacitance. The post-SBL anneal may be conducted using a rapid thermal process (RTP), also known as rapid thermal anneal (RTA), at a temperature from about 830° C. to about 1150° C., typically about 1000° C. to about 1100° C. The post-SBL anneal will preferably be conducted under a non-oxidizing atmosphere, typically in an $N_2$ gas ambient, although other inert gases such as Ar or gas mixtures may be used. In addition to the RTP process, the post-SBL anneal may be conducted with any suitable heating process including, for example, laser annealing, spike annealing and flash annealing.

As illustrated in FIG. 4E, the substrate is typically treated with a HF solution and possibly other substances to remove any native oxide that has formed on the exposed silicon surfaces. After the silicon surfaces have been cleaned, a layer of a silicidation metal or metal alloy 71, such as a nickel/tantalum alloy, and preferably a capping layer (not shown), such as titanium nitride, may then be formed over the reactivated gate structure, LDD and source/drain regions and isolation regions. When forming a nickel silicide, the device may then be annealed at a temperature, typically between about 400° C. and about 530° C., and preferably at least above 450° C., and for a time period sufficient to cause the metal or metal alloy layer 71 to react with the exposed silicon of the active region and form a silicide region 71b and/or the gate electrode region and form a silicide region 71a using, for example a rapid thermal anneal (RTP) process. In particular, when forming a nickel silicide, it is preferred that the silicidation temperature not exceed about 550° C. to suppress formation of the more resistive tertiary nickel silicide $NiSi_2$ in favor of the less resistive secondary nickel silicide NiSi.

Depending on the silicidation metal or metal alloy utilized, the silicidation temperature will be adjusted accordingly to ensure both that the desired silicide is formed substantially completely and that the thermal budget contribution of this process is not excessive. Because the formation of the silicide is largely or completely confined to those regions in which a silicon surface was intentionally exposed prior to the deposition of the nickel alloy 71, the silicide formation will be considered a self-aligned silicide (salicide).

Figure 4F:
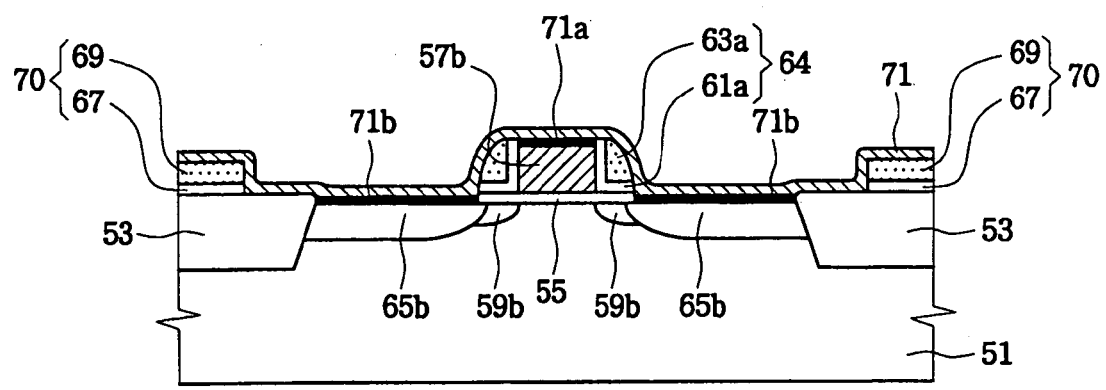
Figure 4G:
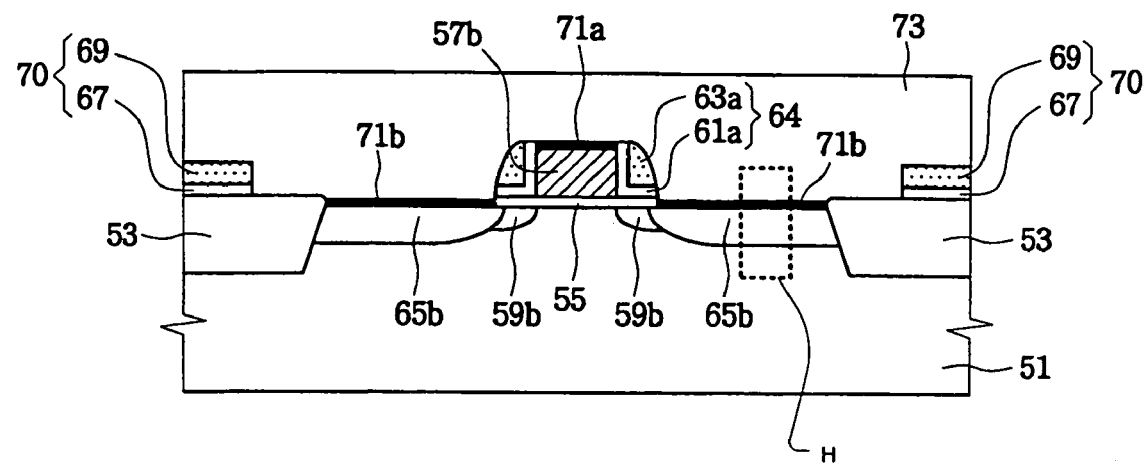

As illustrated in FIG. 4G, the capping layer (not shown), if used, and the unreacted portion of the metal or metal alloy layer 71 may be removed using, for example, a solution including sulfuric acid, $H_2SO_4$, and hydrogen peroxide, $H_2O_2$, leaving the silicide regions 71a, 71b on the surface of the gate electrode and source/drain regions within the active region respectively. An interlayer dielectric layer (ILD) 73 may be formed over the substrate. Although illustrated as a single layer, those of ordinary skill in the art will appreciate that the ILD 73 may include more than one layer, more than one material and may be subjected to additional processing such as chemical-mechanical polishing or etchback processing to improve the planarity of the resulting surface. Contact openings (not shown) in the ILD and metal patterns (not shown) may then be formed using a wide variety of conventional and/or proprietary deposition, etch and metallization processes and materials to provide the electrical connections to the transistors and other circuit elements necessary to produce a functional device.

As illustrated in FIGS. 4E-G, if the composition of the gate structure is such that a silicon surface is exposed during the deposition of the metal or metal alloy layer, a silicide may be formed at the upper surfaces of both the source drain regions and the gate electrode. However, those of ordinary skill in the art will appreciate that by modifying the structure illustrated in FIG. 4D through the use of the SBL or a combination of other process steps suitable for forming a barrier layer or layers, it is possible to form the silicide regions selectively in only the S/D regions or on the gate electrode. For example, if the gate electrode structure 57 is manufactured to include a doped polysilicon layer surrounded by one or more barrier or capping layers, the formation of a silicide region on the gate electrode may be suppressed, resulting in selective formation in only the exposed source/drain regions.

Figure 4H:
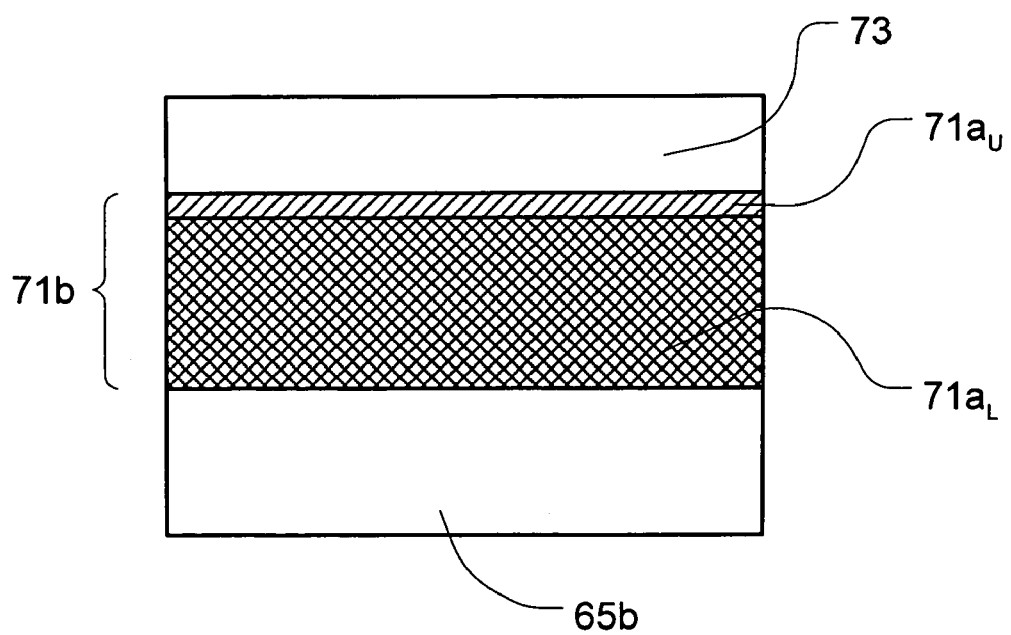
FIG. 4H is an enlarged illustration of a portion H of the silicide structure in a S/D region manufactured according to the method illustrated in FIGS. 4A-F using a nickel/tantalum alloy as the silicidation metal.

As illustrated in FIG. 4H, which represents the region H indicated in FIG. 4G, when certain metals and metal alloys are used in the silicidation process, for example nickel-tantalum alloys, the silicidation process will produce a two-layered silicide structure in which the primary metal may be preferentially segregated into a lower layer $71a_L$ with the alloying metal remaining primarily in the upper layer $71a_U$.

Experimental Data

To study the effect of dopant deactivation on transistor, Vth of long channel transistors are monitored for different additional annealing performed between dopant activation and salicide process. (No SBL process is applied). As illustrated in FIGS. 2A and 2B, however, when semiconductor devices are processed according to the conventional process illustrated in FIG. 1, the temperatures experienced during processing subsequent to the activation anneal may affect the performance of the resulting devices. In particular, processes such as the formation of a silicon blocking pattern during which the process temperature does not exceed about 700° C., a portion of the activated dopant species will tend to deactivate, thereby tending to increase both the resistance of the implanted regions and the threshold voltage of the affected transistors. This dopant deactivation, therefore, both tends to reduce the speed and decrease the current carrying capabilities of the resulting devices, thereby tending to degrade the operational performance, and perhaps functionality, of the resulting devices. In the case of cdbalt salicidation, dopant can be reactivated at S70 of FIG. 1. because cobalt salicidation is performed at about 850° C. But in case of nickel salicidation, dopant can not be reactivated at S70 of FIG. 1. because nickel salicidation is performed at less than 500° C.

In order to demonstrate the utility and effectiveness of the present invention, a number of NMOS and PMOS transistors and gate oxide capacitors were prepared using both conventional processes and materials, modified conventional processes, and exemplary processes and materials according to the present invention. Various evaluations were then conducted to collect data regarding threshold voltage, $V_{th}$, drain saturation current, $I_{dsat}$, and capacitance-voltage, C-V, and sheet resistance, $R_s$, performance as a function of the materials and processes utilized.

Figure 2A:
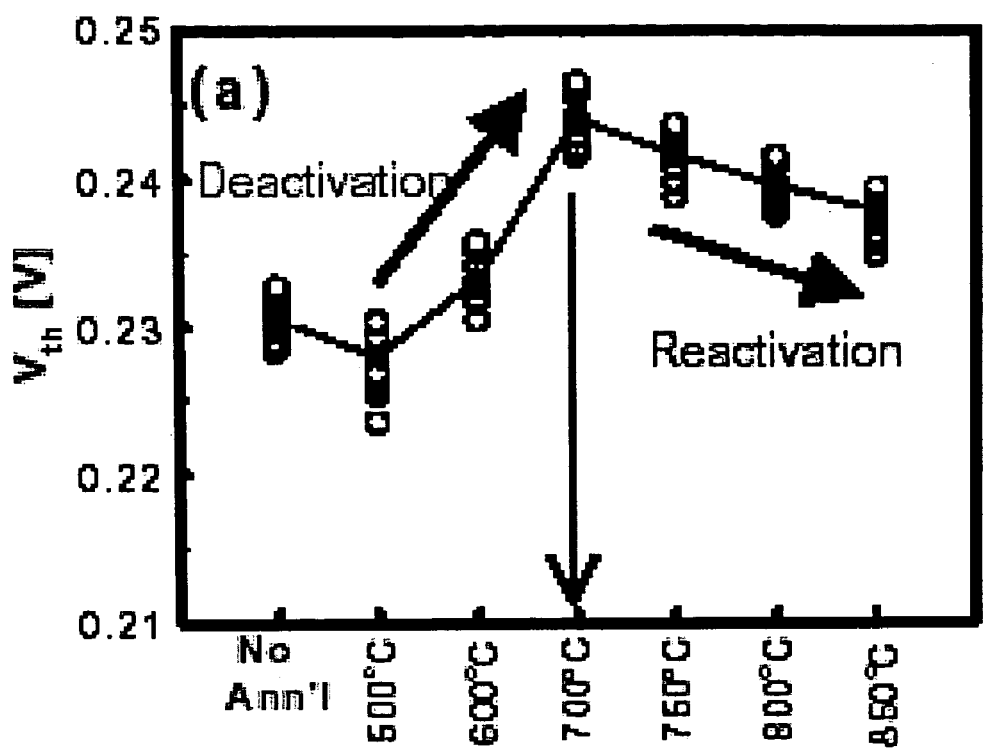
FIGS. 2A and 2B are graphs illustrating the temperature dependence of the deactivation and activation of dopants for NMOS and PMOS transistors.
Figure 2B:
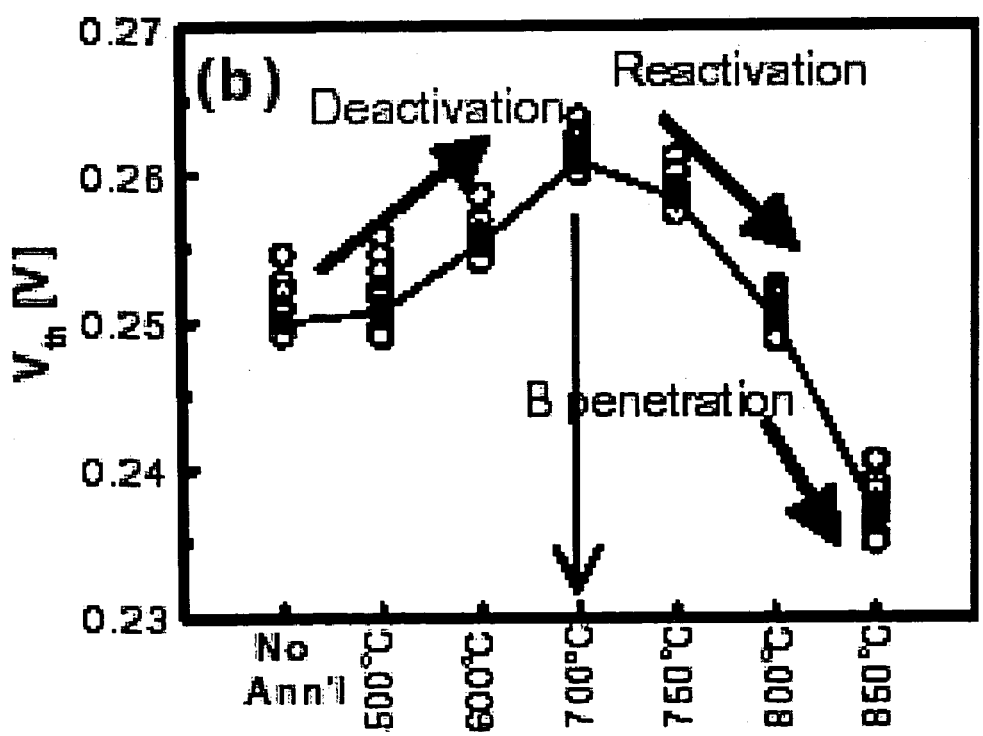
Figure 5A:
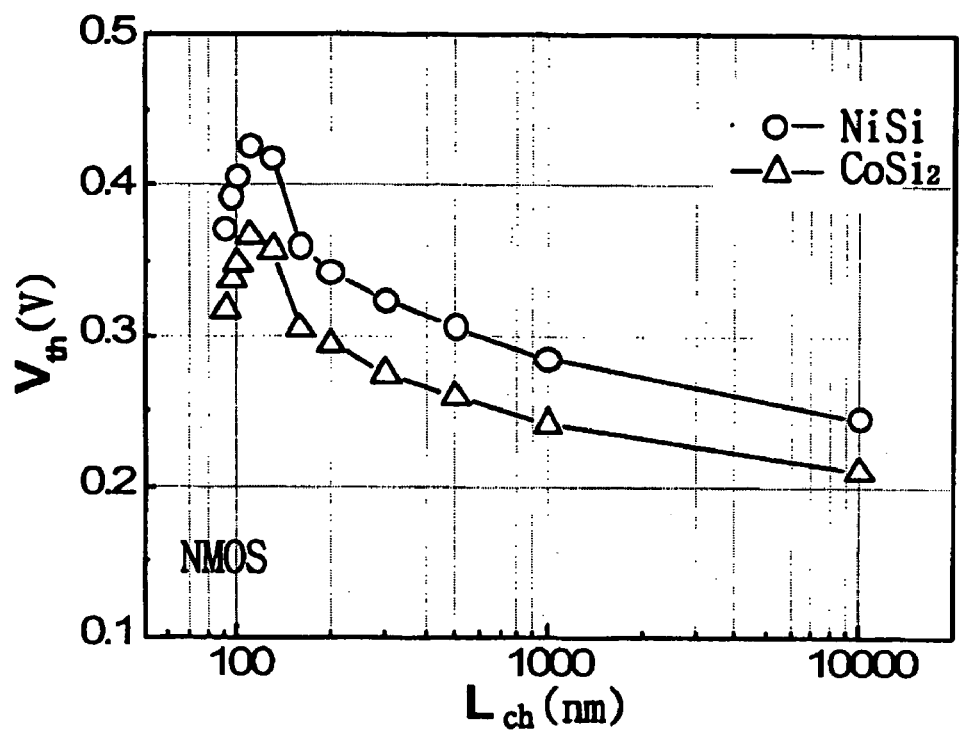
FIGS. 5A-B are graphs illustrating the threshold voltage $V_{th}$ variations in NMOS and PMOS transistors using $CoSi_2$ and NiSi silicides.
Figure 5B:
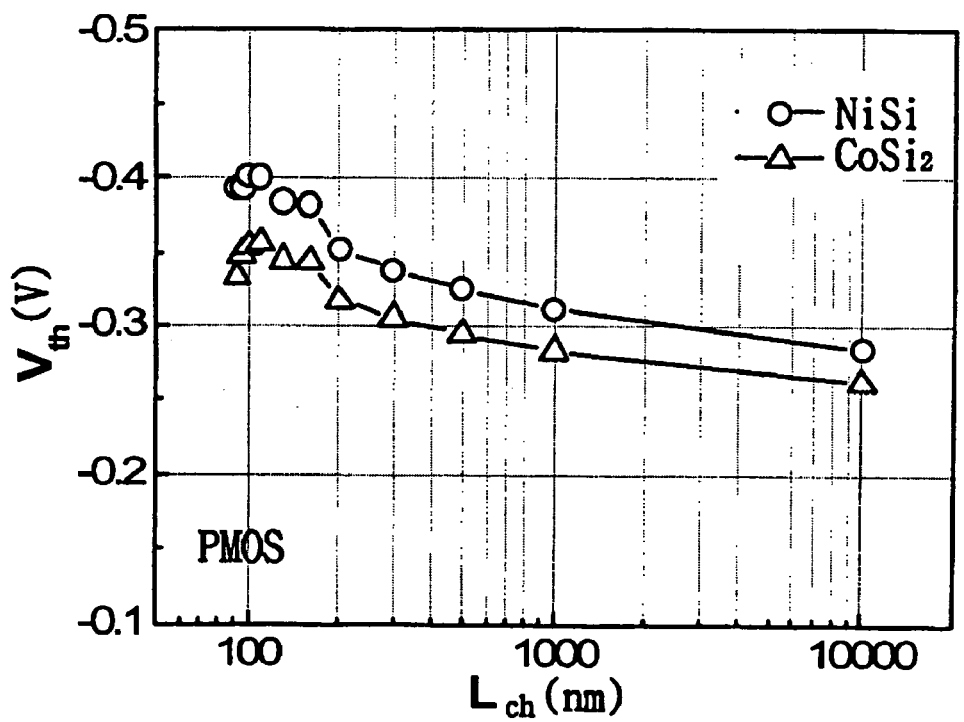

As illustrated in FIGS. 5A-B, when employing a conventional process according to FIG. 1 in which the silicidation process occurs after the SBL formation, those metals and metal alloys that utilize a higher silicidation temperature, such as Co (plotted as Δ) with its silicidation temperature in excess of about 750° C., the dopant that was deactivated during the SBL process is reactivated. Those silicidation processes, however, that utilize a metal or metal alloy having a lower silicidation temperature, such as nickel or a nickel alloy (plotted as ○) processed below about 530° C., there tends to be no reactivation and indeed, depending on the temperature, may be further deactivation, of the dopants. The impact of the silicidation temperature is reflected in the graphs presented as FIGS. 5A and 5B, showing the increase in threshold voltage $V_{th}$ in both NMOS and PMOS devices associated with the lower temperature silicidation process used to form NiSi as opposed to the higher temperature silicidation process used to form $CoSi_2$.

Figure 6A:
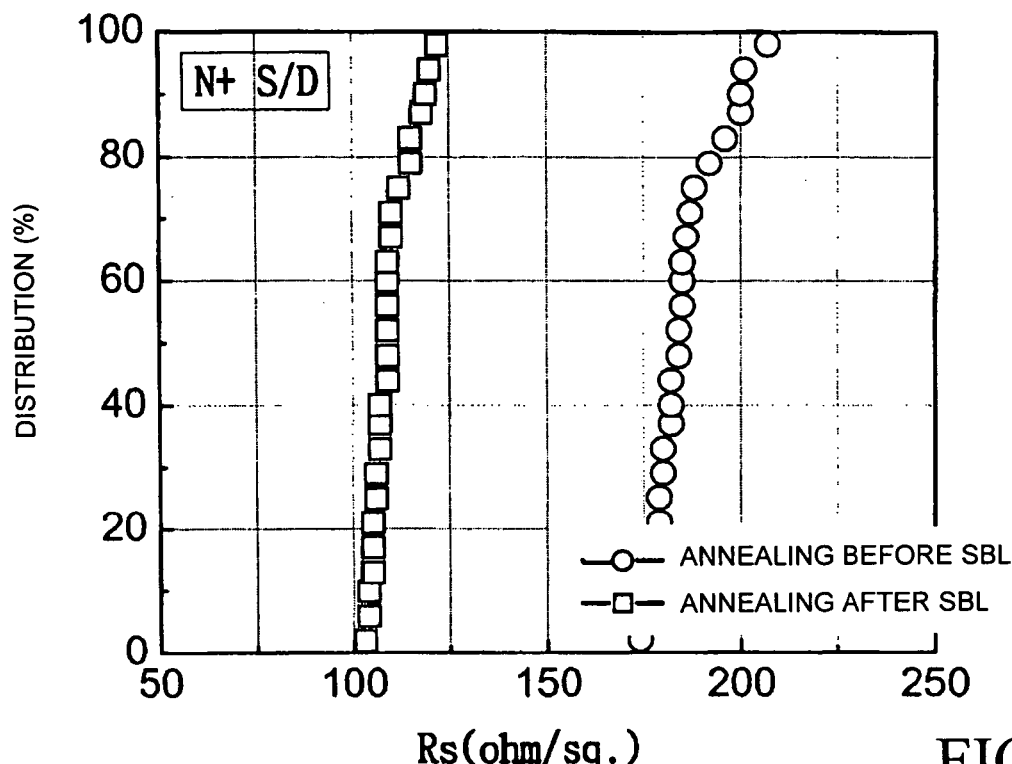
FIGS. 6A-B are graphs illustrating the sheet resistance distributions of N+ (S/D) and N− (LDD) doped regions as a function of the anneal/SBL sequence.
Figure 6B:
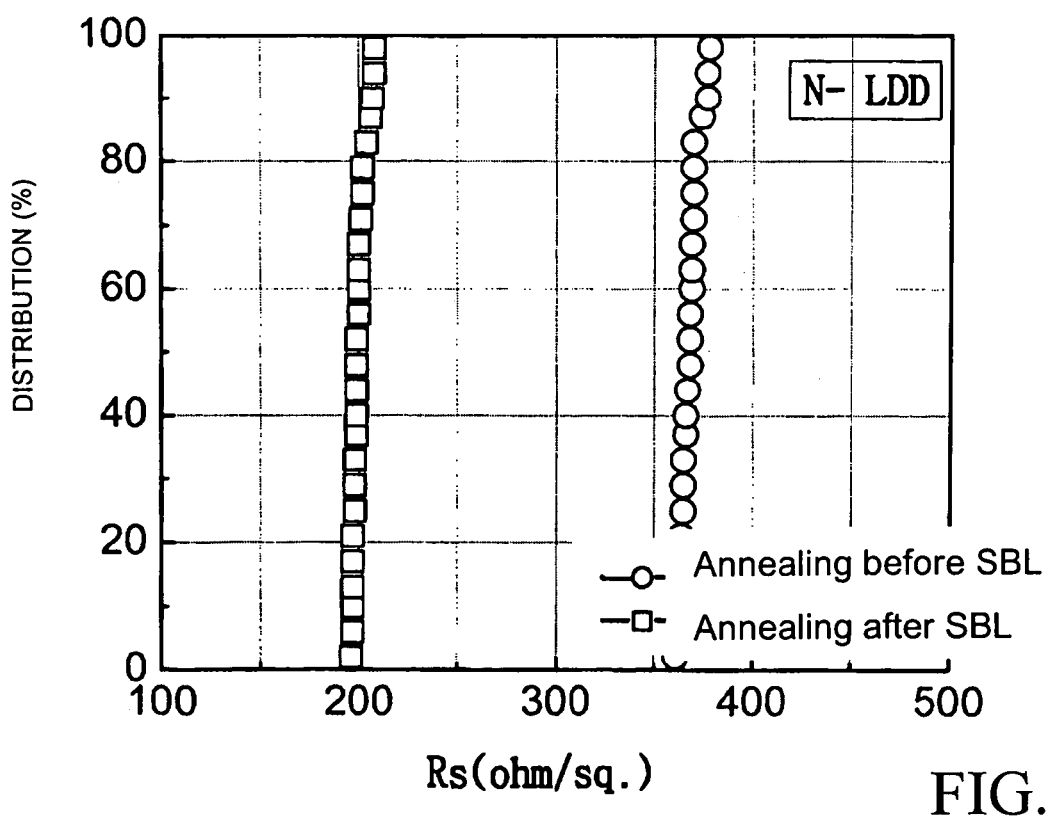

As illustrated in FIGS. 6A-B, the dopant deactivation associated with SBL formation after the activation anneal (plotted as ○), if not remedied by a later reactivation anneal (plotted as □) performed after the SBL formation, will tend to increase both the magnitude and the variation in the sheet resistance $R_s$ of the underlying LDD and S/D regions. This increased resistance, if uncorrected, will tend to reduce the speed of the resulting devices and to reduce the saturation currents that can be obtained.

Figure 7A:
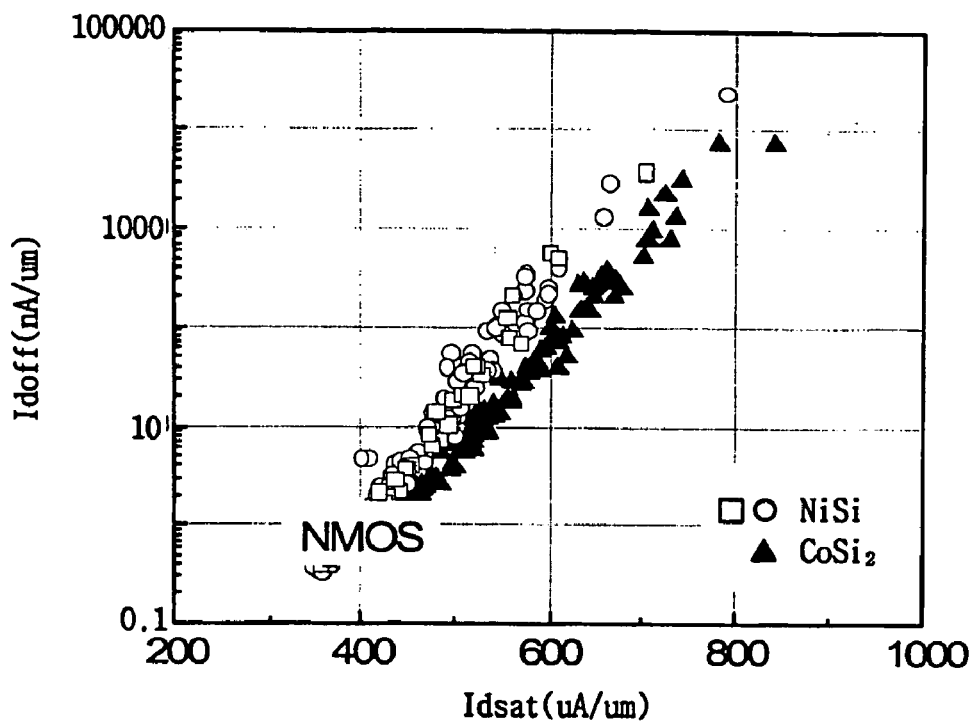
FIGS. 7A-B are graphs illustrating the drain saturation current $I_{dsat}$ in NMOS and PMOS transistors using $CoSi_2$ and NiSi silicides.
Figure 7B:
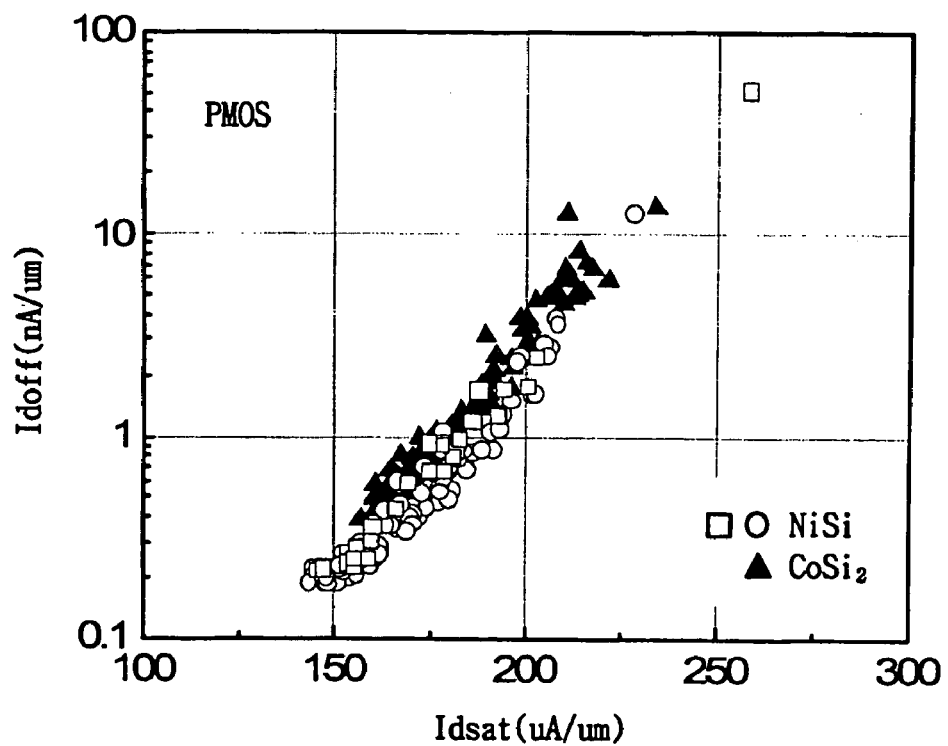

As illustrated in FIGS. 7A-B, when employing a process generally corresponding to the conventional process illustrated in FIG. 1, NMOS and PMOS devices utilizing a $CoSi_2$ silicide (plotted as ▲) demonstrate higher saturation drain current, $I_{dsat}$, values than those obtained using a lower temperature silicide, specifically NiSi (plotted as ○ and □). When evaluated at a drain current off, $I_{doff}$, value of 10 nA, the NMOS transistors illustrate a degradation in $I_{dsat}$ of about 8%. A similar evaluation of the PMOS transistors reveals a degradation of about 5% or less, due probably in part to the improved conductivity provided by the silicide.

Figure 8A:
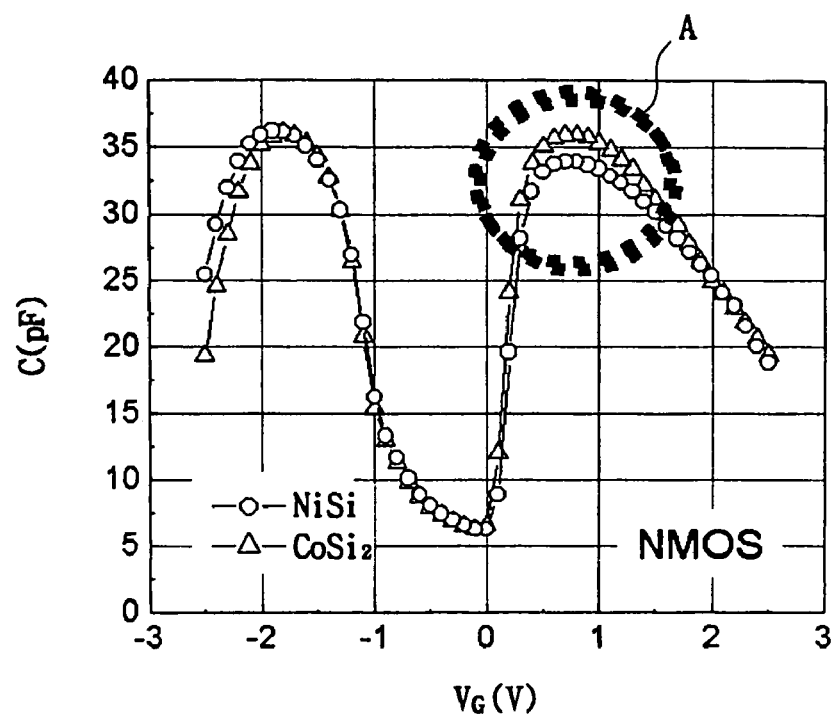
FIGS. 8A-B are graphs illustrating the poly gate depletion effect for 500° C. and 750° C. SBL processes for NMOS and PMOS transistors.
Figure 8B:
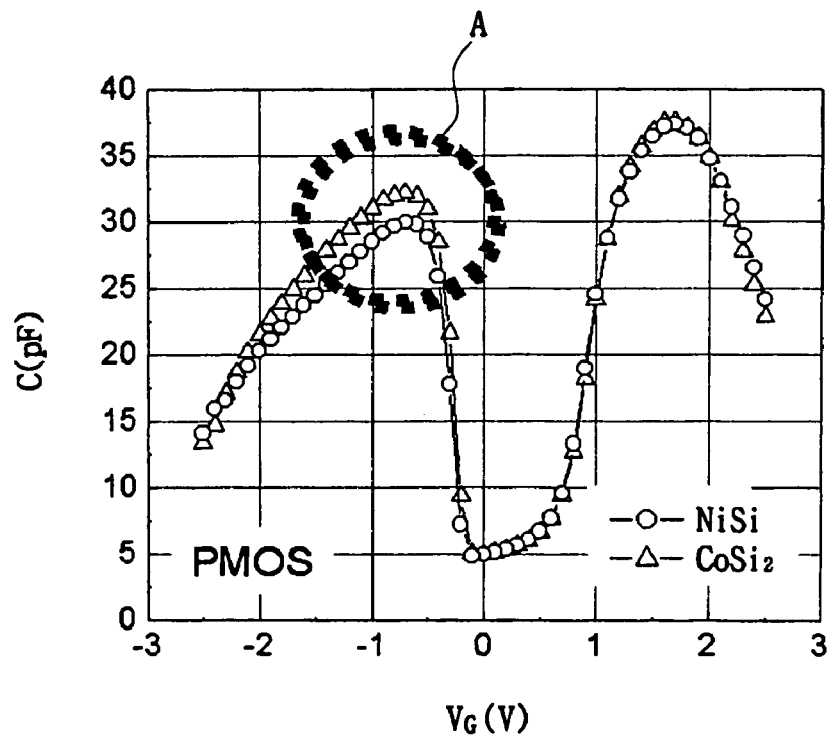

As illustrated in the capacitance-voltage curves in FIGS. 8A-B, when employing a conventional process according to FIG. 1 in which the silicidation process occurs after the SBL formation, those metals and metal alloys that utilize a higher silicidation temperature, such as Co (plotted as Δ) with its silicidation temperature in excess of about 750° C., at least a portion of the dopant that was deactivated during the SBL process can be reactivated. Those silicidation processes, however, that utilize a metal or metal alloy having a lower silicidation temperature, such as nickel or a nickel alloy (plotted as ○) processed at silicidation temperatures below about 530° C., in this instance about 500° C., there tends to be little or no reactivation and indeed, depending on the temperature, there may even be further deactivation, of the dopants. The impact of the post-SBL silicidation temperature is reflected in the graphs presented as FIGS. 8A and 8B, showing, in region A, the decrease in gate capacitance in both NMOS and PMOS devices associated with the lower temperature silicidation process used to form NiSi as opposed to the higher temperature silicidation process used to form $CoSi_2$. As reflected in FIGS. 8A and 8B, the deactivation of the dopant(s) by the SBL process decreased the gate oxide C-V inversion capacitance by about 10%.

Figure 9A:
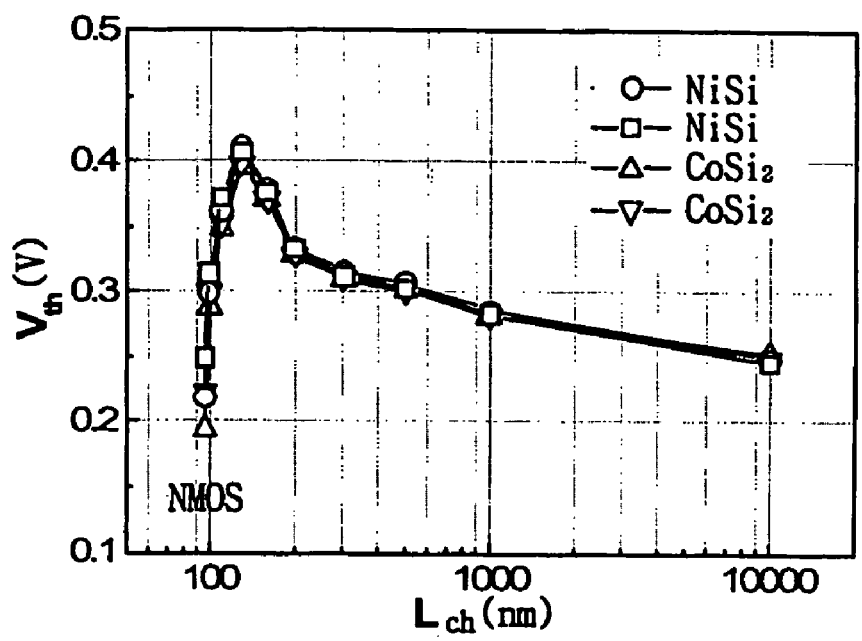
FIGS. 9A-B are graphs illustrating the $V_{th}$ variation according to gate length for NMOS and PMOS transistors using $CoSi_2$ and NiSi silicides without an SBL process.
Figure 9B:
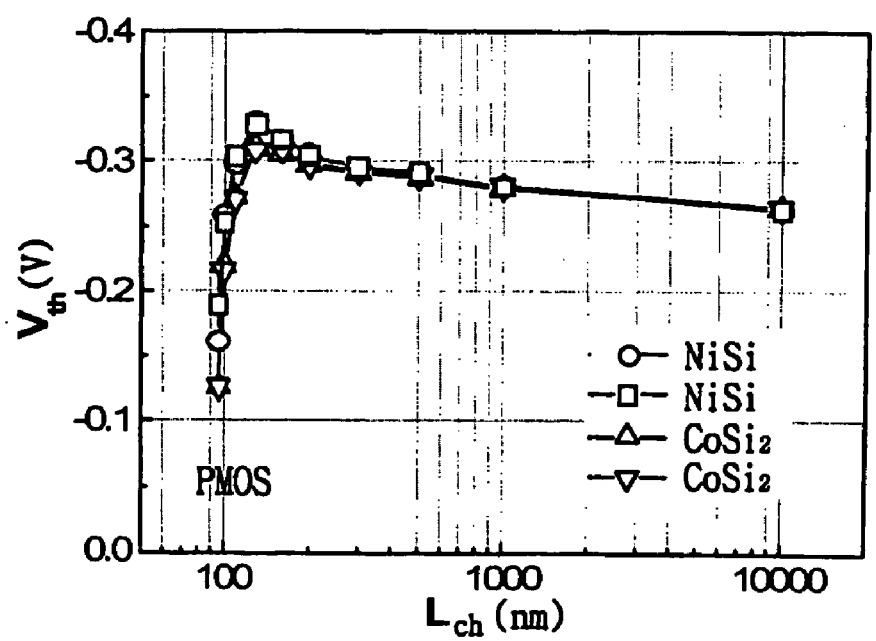
Figure 10A:
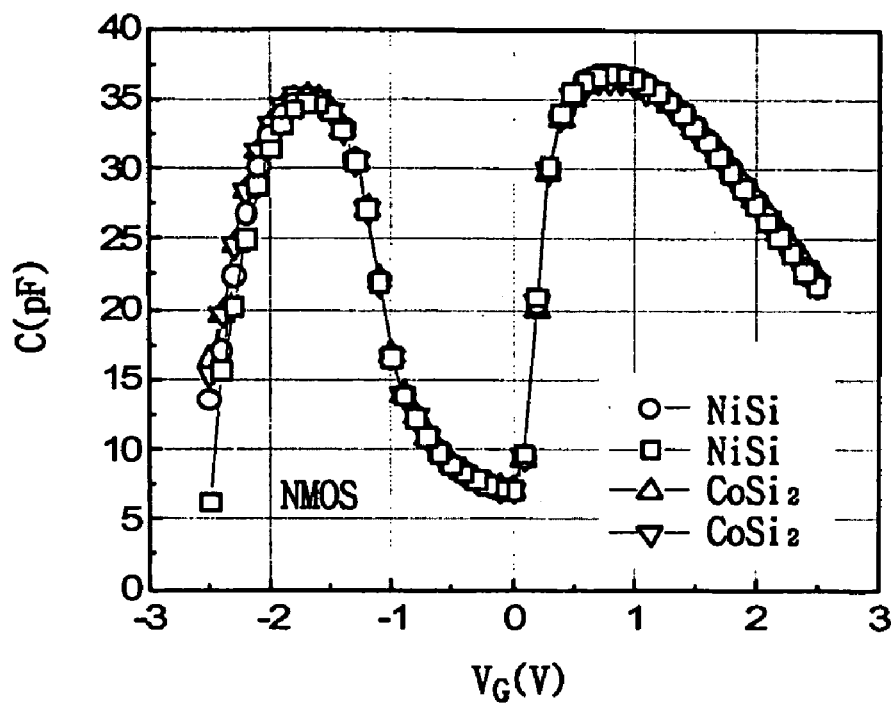
FIGS. 10A-B are graphs illustrating the gate oxide capacitance-voltage (C-V) curves for NMOS and PMOS transistors using $CoSi_2$ and NiSi silicides without an SBL process.
Figure 10B:
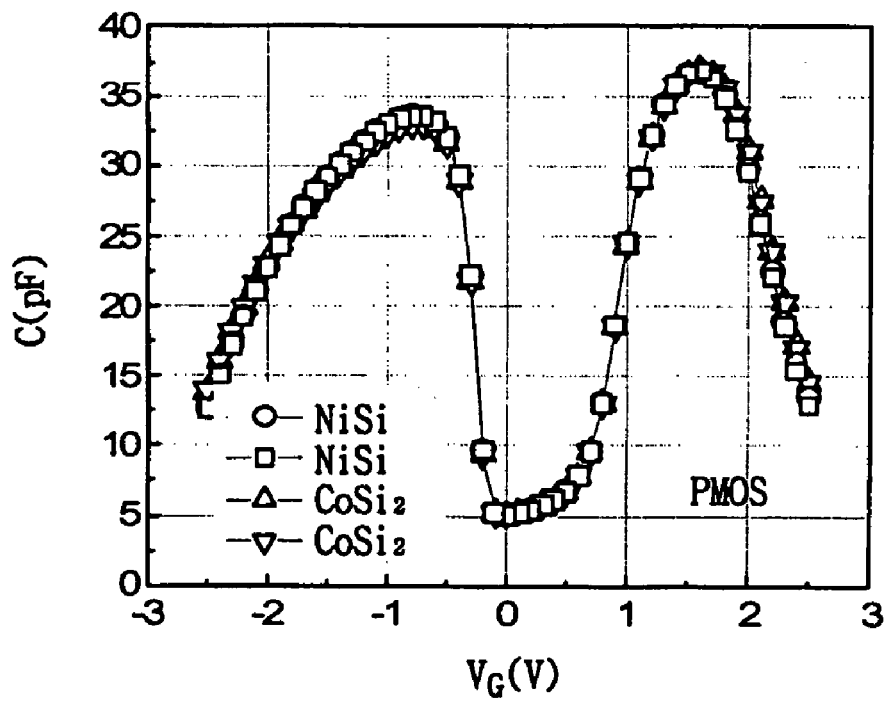

As illustrated in FIGS. 9A-B, when employing a conventional process generally according to FIG. 1, but without performing the SBL step, there is very little difference in the threshold voltage $V_{th}$ between transistors utilizing metals and metal alloys having higher silicidation temperature, such as Co (plotted as triangles) and those utilizing metals having lower silicidation temperatures, such as a nickel alloy (plotted as ○ and □) processed at about 500° C. Indeed, the $V_{th}$ data plotted in FIGS. 9A-B tend to reflect the substantially identical NMOS and PMOS threshold voltages obtained for both $CoSi_2$ and NiSi silicides, indicating the impact of the dopant deactivation during the SBL processing silicidation temperature. This conclusion is reinforced by the data presented in FIGS. 10A-B, which plot the C-V curves for gate oxide capacitors manufactured with both $CoSi_2$ and NiSi silicides that did not receive the conventional the SBL processing. Particularly when compared with the corresponding graphs illustrated in FIGS. 8A-B, the degradation in performance resulting from the dopant deactivation is clearly reflected in both the NMOS and PMOS data.

Figure 11A:
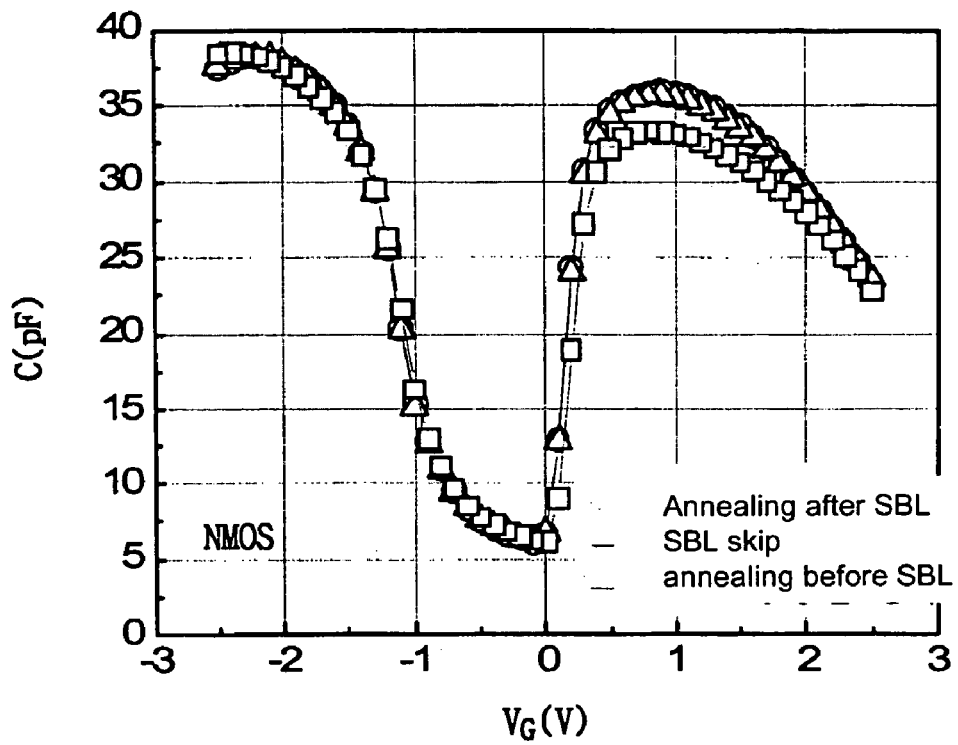
FIGS. 11A-B are graphs illustrating the gate oxide capacitance-voltage (C-V) curves for NMOS and PMOS transistors using NiSi silicide as a function of the presence and timing of activation anneals and an SBL process.
Figure 11B:
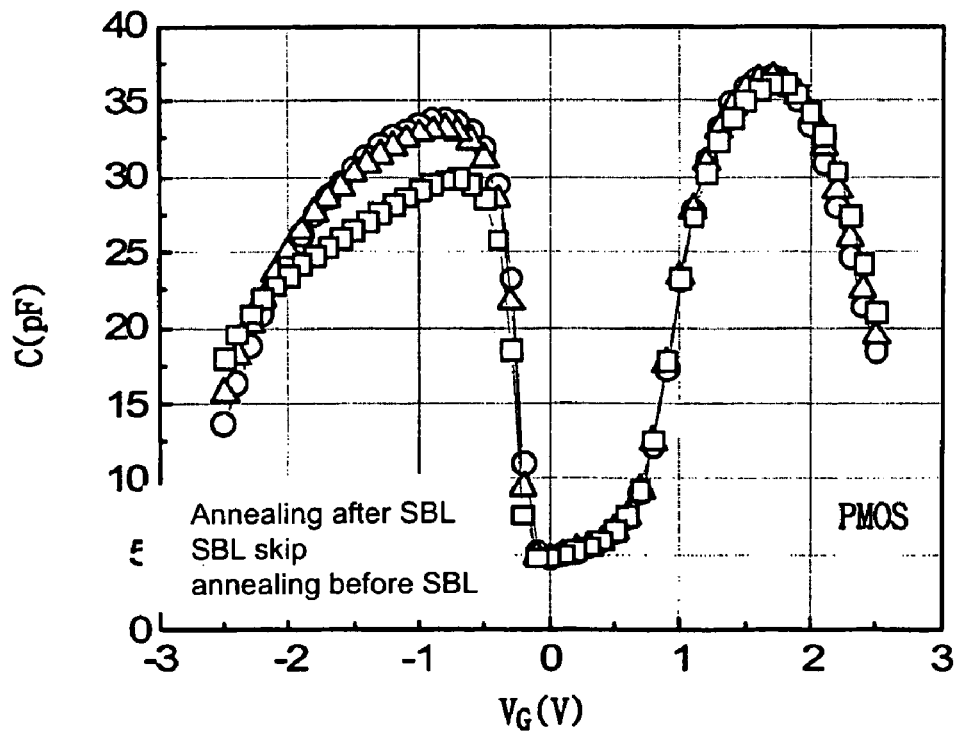

As illustrated in FIGS. 11A-B, a comparison of gate oxide capacitors with Ni-silicide manufactured using the conventional process according to FIG. 1 (plotted as □), the conventional process without the SBL step (plotted as Δ) and an exemplary embodiment of the present invention including a post-SBL anneal (plotted as ○) illustrates the utility of the post-SBL anneal to reactivate the dopant. This result is reflected in the substantial uniformity of the C-V curves generated for the SBL-less process and the post-SBL anneal process, both of which demonstrate capacitance greater than that obtained by the conventional process.

Figure 12A:
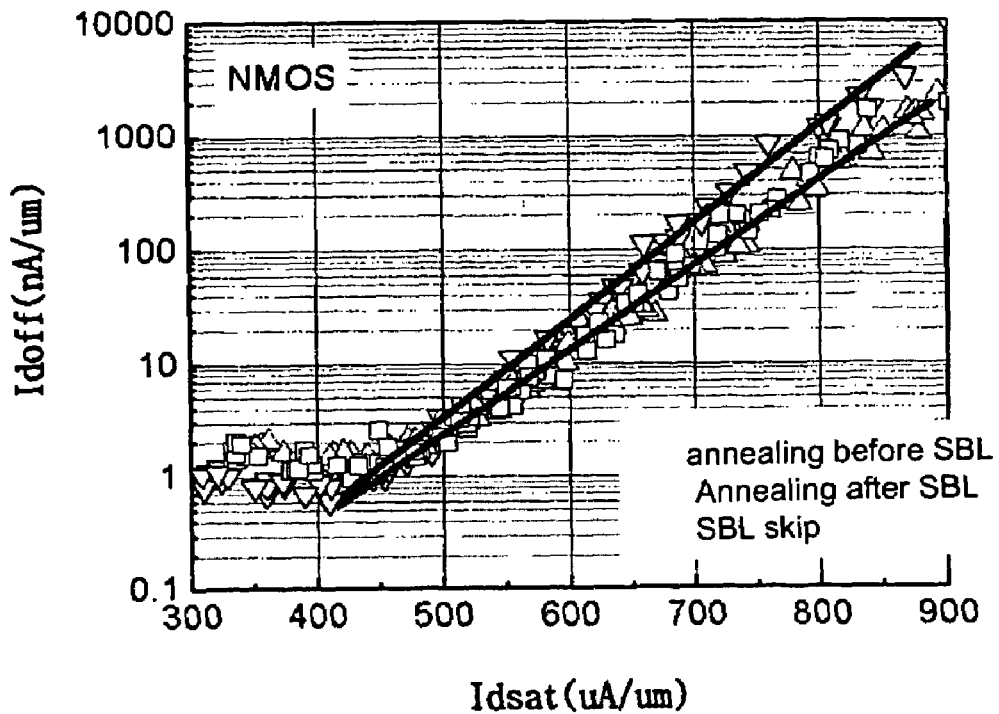
FIGS. 12A-B are graphs illustrating the drain saturation current $I_{dsat}$ in NMOS and PMOS transistors using NiSi silicide as a function of the presence and timing of activation anneals and an SBL process.
Figure 12B:
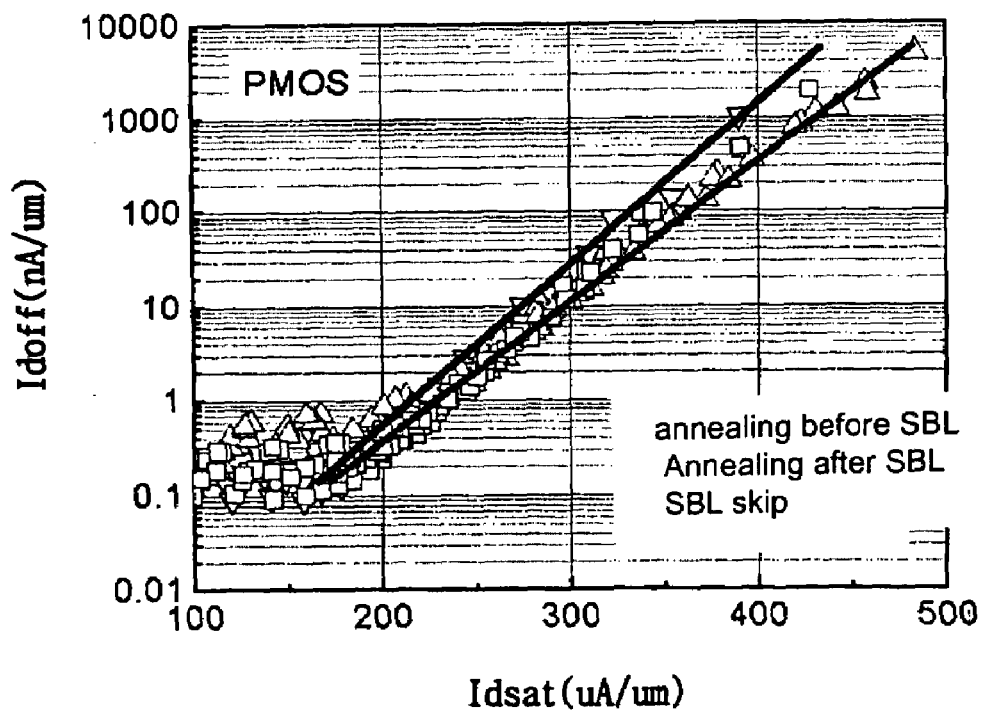

As illustrated in FIGS. 12A-B, a comparison of the drain saturation current, $I_{dsat}$, and the drain off current, $I_{doff}$, for both NMOS and PMOS transistors having Ni-silicide manufactured using the conventional process according to FIG. 1, the conventional process without the SBL step (plotted as □) and an exemplary embodiment of the present invention including a post-SBL anneal (plotted as Δ) further illustrates the utility of the post-SBL anneal to reactivate the dopant. As illustrated by the respective plots, the $I_{dsat}$ at a given $I_{doff}$ level for transistors according to the present invention is increased relative to the conventional method. At an $I_{doff}$ of 10 nA, for example, the NMOS transistors manufactured according to the present invention illustrate an improvement of about 5% in the activated dopant.

Figure 13A:
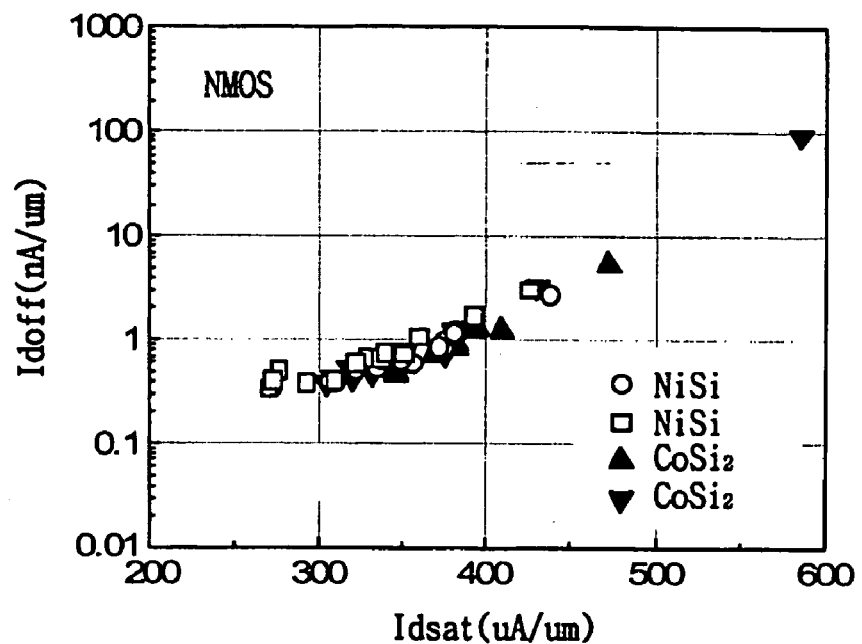
FIGS. 13A-B are graphs illustrating the drain saturation current $I_{dsat}$ in NMOS and PMOS transistors using various Co and Ni silicides manufactured using the SBL skip process.
Figure 13B:
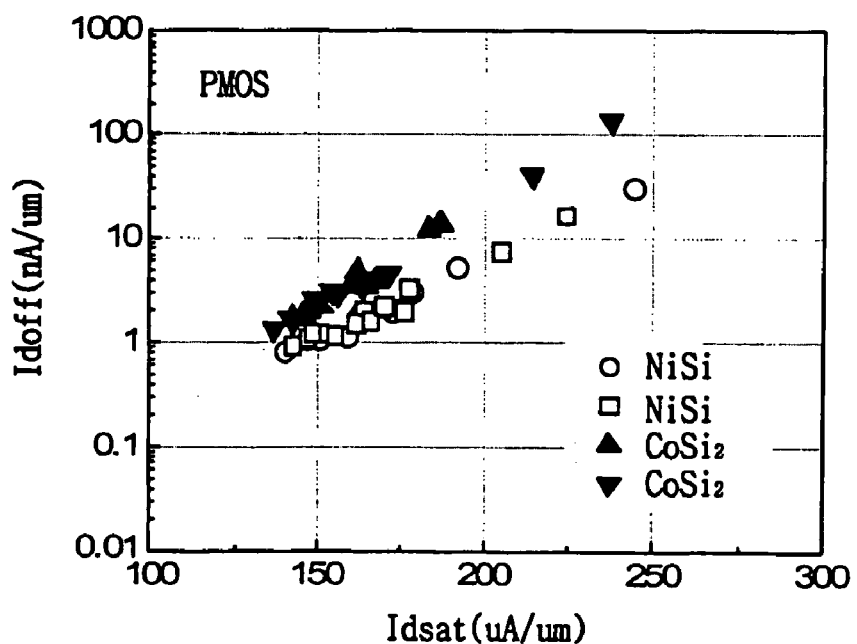

As illustrated in FIGS. 13A-B, by avoiding the dopant deactivation associated with the SBL process, transistors incorporating a Ni-silicide (plotted as ○ and □) may be produced with electrical performance, specifically $I_{dsat}$, that is substantially the same or improved relative to similar Co-silicide transistors (plotted as triangles). Utilizing an exemplary embodiment of the process according to the present invention, by reactivating a portion of the dopant "lost" during the SBL process, permits the use of metals and metal alloys having lower silicidation temperatures, such as nickel and nickel alloys, that may be processed at temperatures below about 700° C.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents. Silicide can be formed only on source/drain or only on gate. And the present invention can be applied to make total gate silicidation.

What is claimed is:

1. A method of forming a semiconductor device comprising, in order:
    implanting dopant into a substrate to form a source/drain region;
    annealing the substrate to form activated dopant in the source/drain region;
    forming a silicide blocking layer on the substrate, thereby deactivating a portion of the activated dopant;
    annealing the substrate to reactivate a portion of the deactivated dopant, the annealing being conducted at an anneal temperature $T_{pa}$;
    exposing silicon surfaces on the substrate; and
    forming silicide layers on the exposed silicon surfaces, the silicide layers being formed at a silicidation temperature $T_s$, wherein $T_s<T_{pa}$.

2. A method of forming a semiconductor device according to claim 1, wherein:
    forming the silicide layers includes depositing a nickel alloy layer on the exposed silicon surfaces, the nickel alloy including nickel and an alloying metal; and
    reacting the nickel alloy layer with the exposed silicon surface to form a nickel silicide layer having an upper layer and a lower layer, wherein the alloying metal is preferentially segregated in the upper layer.

3. A method of forming a semiconductor device according to claim 2, wherein:
    the lower layer includes at least 95 atomic percent nickel and silicon.

4. A method of forming a semiconductor device according to claim 3, wherein:
    the lower layer includes at least 99 atomic percent nickel and silicon.

5. A method of forming a semiconductor device according to claim 4, wherein:
    the nickel and silicon are present in the lower layer in an atomic ratio of about 1.

6. A method of forming a semiconductor device according to claim 2, further comprising:
    forming a capping layer on the nickel alloy layer before reacting the nickel alloy with the exposed silicon.

7. A method of forming a semiconductor device according to claim 6, wherein:

the capping layer includes a major portion of titanium nitride.

8. A method of forming a semiconductor device according to claim 2, wherein:
the alloying metal is at least one metal selected from a group consisting of tantalum, vanadium, zirconium, hafnium, tungsten, cobalt, platinum, chromium, palladium, niobium and combinations thereof, and constitutes no more than about 20 atomic percent of the nickel alloy.

9. A method of forming a semiconductor device according to claim 2, wherein:
the alloying metal is tantalum and is present in a concentration of between about 0.1 and about 10 atomic percent of the nickel alloy.

10. A method of forming a semiconductor device according to claim 9, wherein:
$T_s < 550°$ C. and $T_{pa} < 750$ C.

11. A method of forming a semiconductor device according to claim 10, wherein:
$T_s$ is between about 400 and about 530° C. and $T_{pa}$ is between about 830 and about 1150° C.

12. A method of forming a semiconductor device comprising, in order:
forming an active region in a semiconductor substrate;
forming a gate electrode structure in the active region;
implanting a first dopant into the active region adjacent the gate electrode structure;
forming spacers adjacent the gate electrode structure;
implanting a second dopant into the active region adjacent the spacers;
activating the first and second dopants to form activated dopants;
forming a silicide blocking layer on the substrate, thereby deactivating a portion of the activated dopants;
annealing the semiconductor substrate at a temperature $T_a$ to reactivate a portion of the first and second dopants deactivated during the formation of the silicide blocking layer;
exposing a silicon surface on the substrate;
forming a metal layer in direct contact with the exposed silicon surface; and
reacting the metal layer with the exposed silicon surface to form a silicide layer on the silicon surface at a silicidation temperature $T_s$, wherein $T_s < T_a$.

13. A method of forming a semiconductor device according to claim 12, wherein:
forming the silicide layers includes depositing a metal layer on the exposed silicon surfaces, the metal layer being capable of forming a silicide at a silicidation temperature $T_s$ of less than 700° C.

14. A method of forming a semiconductor device according to claim 12, wherein:
the silicide blocking layer is formed at a temperature $T_{b1}$ that is below about 830° C.

15. A method of forming a semiconductor device according to claim 12, wherein:
the silicide blocking layer is formed at a temperature $T_{b1}$ that is between about 535 and about 825° C.

16. A method of forming a semiconductor device according to claim 12, wherein:
the silicide layer is formed at a temperature $T_s$ that is between about 400 and about 530° C.

17. A method of forming a semiconductor device according to claim 12, wherein:
the substrate is annealed at a temperature $T_a$ that is at least about 830° C.

18. A method of forming a semiconductor device according to claim 12, further comprising:
forming a capping layer on the metal layer before reacting the metal layer with the exposed silicon.

19. A method of forming a semiconductor device according to claim 18, wherein:
the capping layer includes a major portion of titanium nitride.

20. A method of forming a semiconductor device according to claim 19, wherein:
the capping layer has a nitrogen:titanium atomic ratio of at least about 0.5.

21. A method of forming a semiconductor device according to claim 12, wherein:
the metal layer is nickel alloyed with one or more minor metals, the minor metals being selected from a group consisting of tantalum, vanadium, zirconium, hathium, tungsten, cobalt, platinum, chromium, palladium, niobium and combinations thereof, wherein the minor metals constitute no more than about 20 atomic percent of the metal layer.

22. A method of forming a semiconductor device according to claim 21, wherein:
the minor metal is tantalum and is present in a concentration of between about 0.1 and about 10 atomic percent of the metal layer.

23. A method of forming a semiconductor device according to claim 22, wherein:
the silicide layer includes a lower layer and an upper layer, the lower layer having a first thickness and the upper layer having a second thickness, and further wherein
the first thickness is at least 70% of a sum of the first thickness and the second thickness.

24. A method of forming a semiconductor device according to claim 23, wherein:
wherein the first thickness is at least 85% of a sum of the first thickness and the second thickness.

25. A method of forming a semiconductor device according to claim 23, wherein:
the lower layer has a tantalum concentration no greater than about 4.9 atomic percent; and
the upper layer has a tantalum concentration of at least about 5 atomic percent.

26. A method of forming a semiconductor device according to claim 25, wherein:
the lower layer has a tantalum concentration no greater than about 0.5 atomic percent; and
the upper layer has a tantalum concentration no greater than about 60 percent.

27. A method of forming a semiconductor device according to claim 21, wherein:
$T_s < 550°$ C. and $T_a < 750°$ C.

28. A method of forming a semiconductor device according to claim 27, wherein:
$T_s$ is between about 400 and about 530° C. and $T_a$ is between about 830 and about 1150° C.

29. A method of forming a semiconductor device comprising, in order:
implanting a dopant into a substrate to form a source/drain region;
forming a silicide blocking layer on the substrate;
annealing the substrate to activate a portion of the dopant, the annealing being conducted at an anneal temperature $T_a$;
exposing silicon surfaces on the substrate;

forming silicide layers on the exposed silicon surfaces by depositing a nickel alloy layer on the exposed silicon surfaces, the nickel alloy including nickel and an alloying metal; and reacting the nickel alloy layer with the exposed silicon surface to form a nickel silicide layer having an upper layer and a lower layer, wherein the alloying metal is preferentially segregated in the upper layer, and further wherein the silicide layers are formed at a silidation temperature $T_s$, wherein $T_s<T_a$.

30. A method of forming a semiconductor device according to claim 29, wherein:

the lower layer includes at least 95 atomic percent nickel and silicon.

31. A method of forming a semiconductor device according to claim 30, wherein: the lower layer includes at least 99 atomic percent nickel and silicon.

32. A method of forming a semiconductor device according to claim 31, wherein:

the nickel and silicon are present in the lower layer in an atomic ratio of about 1.

33. A method of forming a semiconductor device according to claim 29, further comprising:

forming a capping layer on the nickel alloy layer before reacting the nickel alloy with the exposed silicon.

34. A method of forming a semiconductor device according to claim 33, wherein:

the capping layer includes a major portion of titanium nitride.

35. A method of forming a semiconductor device according to claim 29, wherein:

the alloying metal is at least one metal selected from a group consisting of tantalum, vanadium, zirconium, hafnium, tungsten, cobalt, platinum, chromium, palladium, niobium and combinations thereof, and constitutes no more than about 20 atomic percent of the nickel alloy.

36. A method of forming a semiconductor device according to claim 29, wherein:

the alloying metal is tantalum and is present in a concentration of between about 0.1 and about 10 atomic percent of the nickel alloy.

37. A method of forming a semiconductor device according to claim 36, wherein:

$T_s<550°$ C. and $T_a<750°$ C.

38. A method of forming a semiconductor device according to claim 37, wherein:

$T_s$ is between about 400 and about 530° C. and $T_a$ is between about 830 and about 1150° C.

* * * * *